United States Patent [19]

Danilyak

[11] Patent Number: 5,691,644
[45] Date of Patent: Nov. 25, 1997

[54] NEUTRAL CORROSION CONDITION SURVEY-MITIGATING INDUCED VOLTAGE EFFECTS

[75] Inventor: Boris M. Danilyak, Philadelphia, Pa.

[73] Assignee: Henkels & McCoy, Blue Bell, Pa.

[21] Appl. No.: 644,397

[22] Filed: May 10, 1996

[51] Int. Cl.⁶ .................................................. G01R 31/02
[52] U.S. Cl. ........................... 324/543; 324/523; 324/527; 324/713
[58] Field of Search ........................... 324/66, 67, 71.1, 324/72, 509, 510, 522, 523, 527, 537, 539, 541, 543, 544, 700, 713, 715; 379/26

[56] References Cited

U.S. PATENT DOCUMENTS

| | | | |
|---|---|---|---|
| 3,289,076 | 11/1966 | Edis et al. | 324/530 |
| 3,792,350 | 2/1974 | Bossler et al. | 324/530 |
| 3,991,363 | 11/1976 | Lathrop | 324/529 |
| 4,151,458 | 4/1979 | Seager | 324/71.1 |
| 4,835,478 | 5/1989 | Haddon et al. | 324/536 |
| 4,839,598 | 6/1989 | Calvert et al. | 324/539 |
| 4,929,901 | 5/1990 | Kimball et al. | 324/529 |
| 4,947,469 | 8/1990 | Vokey et al. | 324/523 |
| 5,101,161 | 3/1992 | Walsh et al. | 324/543 |
| 5,126,654 | 6/1992 | Murphy et al. | 324/71.2 |
| 5,210,498 | 5/1993 | Paananen | 324/529 |
| 5,347,212 | 9/1994 | Bass et al. | 324/544 |
| 5,451,862 | 9/1995 | Bass et al. | 324/544 |
| 5,481,198 | 1/1996 | Patel | 324/71.2 |
| 5,498,967 | 3/1996 | Bass et al. | 324/543 |

FOREIGN PATENT DOCUMENTS

| | | |
|---|---|---|
| 0 024 183 | 2/1981 | United Kingdom. |
| WO 90/11533 | 10/1990 | WIPO. |

OTHER PUBLICATIONS

Maloney, Charles A.; "Locating Cable Faults"; IEE Transactions on Industry Applications, vol. 1A-9, No. 4; pp. 380-394, Jul. & Aug. 1973.

Baver, Donald K.; "Overground Method Pinpoints Concentric-Neutral Corrosion"; Wisconsin Electric Power Co.; pp. 49-53, Jul. 1989.

Zastrow, Orville W.; "Underground Corrosion Control and Direct Buried Cables: Cost-Effective Steps For A Complete Program"; Natural Rural Electric Cooperative Association, Washington D.C.; pp. 63-72, undated.

(List continued on next page.)

*Primary Examiner*—Vinh P. Nguyen
*Assistant Examiner*—Diep Do
*Attorney, Agent, or Firm*—Kelley Jasons McGuire & Spinelli, L.L.P.

[57] ABSTRACT

A method of use and system for determining the longitudinal active resistance of a neutral conductor of an underground electrical cable, while the electrical cable remains in service. The method is conducted by applying a selective frequency test current signal to the neutral conductor of the underground cable connected between a pair of grounded structures, e.g., power transformers, from a test signal generator that is connected across the neutral conductor using first and second bifilar winding signal-voltage cables. The method utilizes indirect voltage determination to obtain the voltage drop across the neutral conductor while mitigating induced voltage effects which occur when direct voltage measurement is used. A plurality of selective frequency test current signals are used to obtain a plurality of longitudinal active resistance values. Any conventional extrapolation method is then used to obtain a longitudinal active resistance value at 0 Hz. A further enhancement to this method of use and system is addition of a current balance test and a current partition test. The current balance test determines the ratio of the test current in/out of neutral conductor under test, thereby providing an indication of the electrical continuity or breaks of the neutral conductor. The current partition test determines the ratio of the test current in the neutral conductor to the generator test current, thereby providing a relative indication of the amount of test current actually passing through the neutral conductor under test.

26 Claims, 4 Drawing Sheets

OTHER PUBLICATIONS

Woodsmall, Gregory P. et al.; "Cathodic Protection of Existing URD Systems"; Northern Virginia Electric Cooperative, Manassas, VA; pp. 77–87, undated.

Wagner, John, Jr. et al.; "URD Concentric Neutral Corrosion and Its Control"; PSC Professional Services Group, Narberth, PA; pp. 121–126, undated.

Silver, David A.; "Underground Distribution Cable Designs Resistant to Concentric Neutral Corrosion"; Pirelli Cable Corporation, Union, NJ; pp. 127–138, undated.

Bass, Craig D. et al.; "URD Neutral Corrosion and Damage Detection with Selective Frequency Gradient Mapping and Wave Form Analysis For Metropolitan Edison Company"; Henkels & McCoy, Inc. pp. 1–2, Jan., 1993.

Rhode, Jason P. et al.; "Line Impedance Measurement: A Nondisruptive Wideband Technique"; Department of Electrical and Computer Engineering, North Carolina State University; pp. 2233–2240, Oct. 1995.

Waits, Charles G.; "Concentric Neutral Corrosion—Field Tests and Data Evalution"; Harco Corporation; International Corrosion Forum; pp. 143/1–143/12, Apr. 1981.

Haynes, Gardner S. et al.; "Evaluation of Steel Clad copper Concentric Neutral Wiires in Service"; Texas Instruments, Inc.; International Corrosion Forum; pp. 144/1–144/17, Apr. 1981.

Compton, Kenneth G.; "The Underground Corrosion of Copper and the Effects of a.c. on Concentric Neutrals of URD Cable"; Univeristy of Miami; International Corrosion Forum; pp. 145/1–145/15, Apr. 1981.

Kroon, David H.; "URD Corrosion Experience"; Harco Corporation; International Corrosion Forum; pp. 146/1–146/15, Apr. 1981.

Mitchell, Wiliam J.; "Concentric Neutral Corrosion Effects on Electrical System Operation"; Gilbert/Commonwealth; International Corrosion Forum; pp. 1/1–1/5, Mar. 1980.

Compton, Kenneth G.; "Mechanisms in the Underground Corrosion of the Concentric Neutrals of URD Cable"; University of Miami; International Forum; pp. 271/1–271/8, Mar. 1980.

Haynes, Gardner et al.; "Update on the Corrosion of Steel Clad Copper Concentric Neutral Wire"; Texas Instruments, Inc.; International Corrosion Forum; pp. 278/1–278/9, Apr. 1984.

Compton, Kenneth G.; "The Effect of Variations in the Sulfate and/or Chloride Ion Concentration on the Underground Corrosion of Copper"; University of Miami; International Corrosion Forum; pp. 279/1–279/17, Apr. 1984.

Woodsmall, Gregory P. et al.; "Cathodic Protection of URD Cable Concentric Neutral Wires"; Northern Virginia Electric Cooperative; International Corrosion Forum; pp. 280/1–280/20, Apr. 1984.

Zastrow, Orville W.; "Defining Corrosion Control Requirements From As Found Measurements Along Underground Cables"; International Corrosion Forum; pp. 281/1–281/17, Apr. 1984.

Giesler, Rudolf; "Cathodic Protection of Copper Concentric Neutral cables on the PP&L System"; Pennsylvania Power & Light Company; International Corrosion Forum; pp. 282/1–282/12, Apr. 1984.

Zastrow, Orville W.; "Guide for Underground Corrosion Control on Rural Electric Systems"; National Rural Electric Cooperative Association; pp. 1–75, undated.

NEUTRAL CORROSION CONDITION SURVEY-MITIGATING INDUCED VOLTAGE EFFECTS

BACKGROUND OF THE INVENTION

This invention relates generally to measuring and testing methods of use and systems, and more specifically to methods of use and systems for testing of underground neutral conductors of electrical cables, that form a portion of an electrical system, without removing the electrical cables from operation, to detect the general corrosion condition and integrity of the underground neutral conductors that are detrimental to the safe and efficient operation of the underground electrical cables.

In particular, the present invention is an improvement to the System and Method of Use for Conducting a Neutral Corrosion Survey of U.S. Pat. Nos. 5,347,212, 5,451,862, and 5,498,967 (Bass et al.) which is assigned to the same Assignee, namely Henkels & McCoy, Inc., of the present invention and all of whose disclosures are incorporated by reference herein. In U.S. Pat. Nos. 5,347,212, 5,451,862, and 5,498,967 there is disclosed a system that uses selective frequency current signals (e.g., 20–500 Hz @ 2–15 Amps) that are injected into the neutral conductor of an underground electrical cable that is connected between two electrically grounded structures, e.g., transformer housings, while the cable remains in service carrying normal utility power. AC potential gradients are taken and DC potential shift measurements are conducted to determine precise neutral corrosion status by locating damages and breaks while the cable remains in service delivering power. All data is transmitted to an on-site mobile monitoring station for analysis by, among other things, a computer.

As will be discussed below, in the present invention, the selective frequency measurements determine neutral conductor longitudinal active resistances. By comparison with the neutral DC resistance from cable manufacturers' data, these measurements can identify the presence of corrosion that is occurring on the neutral conductor and its integrity. From this data, the customer can determine whether the electrical cable must be replaced, left alone or precisely surveyed (e.g., in accordance with U.S. Pat. Nos. 5,347,212, 5,451,862, and 5,498,967 (Bass et al.).

The precise neutral corrosion survey is most effective for partially damaged and/or extended neutral conductors. Before proceeding with this survey, it may be desirable to evaluate the general corrosion condition on a particular neutral conductor. This could be done quickly and cost effectively by measuring a longitudinal active resistance for the overall neutral conductor.

One example of a neutral resistance tester that appears to determine the longitudinal active resistance of an underground neutral conductor which is then compared to the reference resistance of an uncorroded neutral is disclosed in U.S. Pat. No. 5,481,198 (Patel), entitled "Method and Device for Measuring Corrosion on a Portion of a Metallic Path Carrying an Undetermined Load Current," and a commercial device made in accordance with the disclosure of U.S. Pat. No. 5,481,198, marketed as "Ω-Check" by Utility Tools and Services, Inc. This test system basically connects to two opposite ends of a neutral conductor (and wherein each end of the neutral conductor is connected to a respective transformer) and injects a 60 Hz test current into the subject neutral conductor. The voltage drop across the neutral conductor (known as direct voltage measurement), the total current flowing through one end of neutral conductor, and the phase angle between this voltage and the total current are measured. From that data, a microprocessor calculates the active resistance per 100 feet of the neutral conductor. A resistance ratio is then determined based on the calculated neutral conductor active resistance value and a neutral conductor reference resistance value. This ratio indicates the condition of the neutral conductor and, based on a threshold ratio value, the customer can decide how to proceed.

However, several problems are encountered with using a longitudinal active resistance value to determine whether to replace a neutral conductor. In order to determine the active resistance, the voltage drop across the neutral conductor, the total current through the neutral conductor and the phase angle between the voltage and the current must be precisely measured. This can be very difficult for extended bare neutral conductors buried in a conductive medium and having current leakage into that medium.

For low frequency AC currents, such a neutral conductor presents a long electric line with propagation parameters: unit length longitudinal impedance (longitudinal active and inductive resistances) and unit length transverse admittance (capacitive and active leakage conductances). In this case, the neutral conductor longitudinal active resistance measured between two transformers is a frequency dependent value, and a non-linear function of neutral length.

To mitigate these method errors a test current frequency variation (selective frequencies) is used in the present invention as well as an extrapolation of test results to a frequency of 0 Hz. The neutral conductor length is taken into account for valid interpretation of test results.

In addition, the neutral conductor also has both metallic and non-metallic current parallel paths, forming a bypass path, which disperses the test current signal, resulting in a reduced test current being measured as the current through the neutral conductor. Hereinafter, the phrase "bypass path" is meant to cover both metallic conductors (e.g., local underground secondary neutrals, telephone lines, TV cables, water lines, etc., that conduct the test current away from the neutral conductor under test) and non-metallic conductors (e.g., soil, water).

Furthermore, it was discovered that direct measurement of the voltage drop on a neutral conductor contains a method error. An additional voltage is induced in the voltmeter circuit by the test current circulating in the test signal circuit. In a general case, when the neutral conductor under test and the bypass path have different power factors (i.e., the cosine of the phase angle between voltage and current), the induced voltage impacts the neutral conductor longitudinal active resistance measurement. Only in a particular case, when the test current in a neutral conductor is in phase with the test current in the bypass path, can the neutral conductor longitudinal active resistance be calculated correctly.

To mitigate this method error, an indirect determination of the voltage drop on a neutral conductor is used in the present invention by measuring the respective voltage drops on a test signal generator and two signal-voltage cables, and using Kirchhoff's voltage law. Also, a bifilar winding of a test current signal conductor and a voltage sensing conductor is employed to minimize magnetic interference on each voltmeter circuit.

Therefore, there remains a need for a method of use and system that determines the longitudinal active resistance of a neutral conductor that forms part of an underground electrical cable while the cable remains in service carrying normal utility power, and whereby that method of use and system account for the frequency dependence of the neutral conductor longitudinal active resistance while mitigating the induced voltage effects.

OBJECTS OF THE INVENTION

Accordingly, it is a general object of the invention to provide a method of use and system which overcomes the disadvantages of the prior art, as applied to electrical cables while the cable remains in service and while the neutral conductor remains connected to the electrically grounded structures.

It is another object of this invention to provide a method of use and system for quickly determining the general corrosion condition and integrity of the neutral conductor of an underground electrical cable.

It is a further object of this invention to provide a method of use and system which enables the determination of the longitudinal active resistance of the neutral conductor of an underground electrical cable, while the cable remains in service.

It is yet another object of this invention to provide a method of use and system that accounts for the frequency dependence of the neutral conductor longitudinal active resistance while mitigating the induced voltage effects when determining the longitudinal active resistance of the neutral conductor.

It is still a further object of this invention to provide a method of use and system for determining the longitudinal active resistance of the neutral conductor of an underground electrical cable to facilitate a subsequent cable rehabilitation program.

It is a further object of the invention to provide a method of use and system for automatically deriving data related to the longitudinal active resistance of the neutral conductor of a tested underground electrical cable.

It is even yet a further object of this invention to provide a method of use and system for deriving data related to the longitudinal active resistance of the neutral conductor for short and extended, bare and jacketed cables, as well as for these cables disposed in conduit(s).

It is a further object of this invention to provide a method of use and system for deriving longitudinal active resistance data that compliments a precise neutral corrosion survey that utilizes selective frequency AC and DC voltage profiles while the cable under test remains in service and the neutral conductor remains grounded.

It is as yet another object of this invention to provide a method of use and system for deriving longitudinal active resistance data at relatively low cost.

SUMMARY OF THE INVENTION

These and other objects of this invention are achieved by providing a method for non-intrusively determining the longitudinal active resistance of a neutral conductor of an underground electrical cable which forms a portion of an electrical system (e.g., a power system, a transmission system, a communication system). The electrical cable additionally comprises a phase conductor carrying AC current therethrough while the electrical cable remains connected to the electrical system providing normal electrical service to the electrical system. The neutral conductor is connected between a pair of electrically grounded structures. The method for determining the longitudinal active resistance is accomplished while leaving the electrical cable in normal operation and comprises the steps of: (a) impressing an electrical test current signal of a selective frequency on the neutral conductor from a test signal generator connected between the electrically grounded structures using a first signal-voltage cable and a second signal-voltage cable, while the electrical cable remains in service providing normal electrical service to the electrical system and while the neutral conductor remains connected to the grounded structures; (b) determining a voltage waveform across the first signal-voltage cable to form a first voltage waveform; (c) determining a voltage waveform across the second signal-voltage cable to form a second voltage waveform; (d) determining a voltage waveform across the test signal generator to form a third voltage waveform; (e) determining a current waveform through the neutral conductor; and then (f) calculating a longitudinal active resistance value from the determined waveforms and whereby each of the waveforms includes a respective RMS (root-mean-square) magnitude.

DETAILED DESCRIPTION OF THE PREFERRED EMBODIMENT

Figure 1:
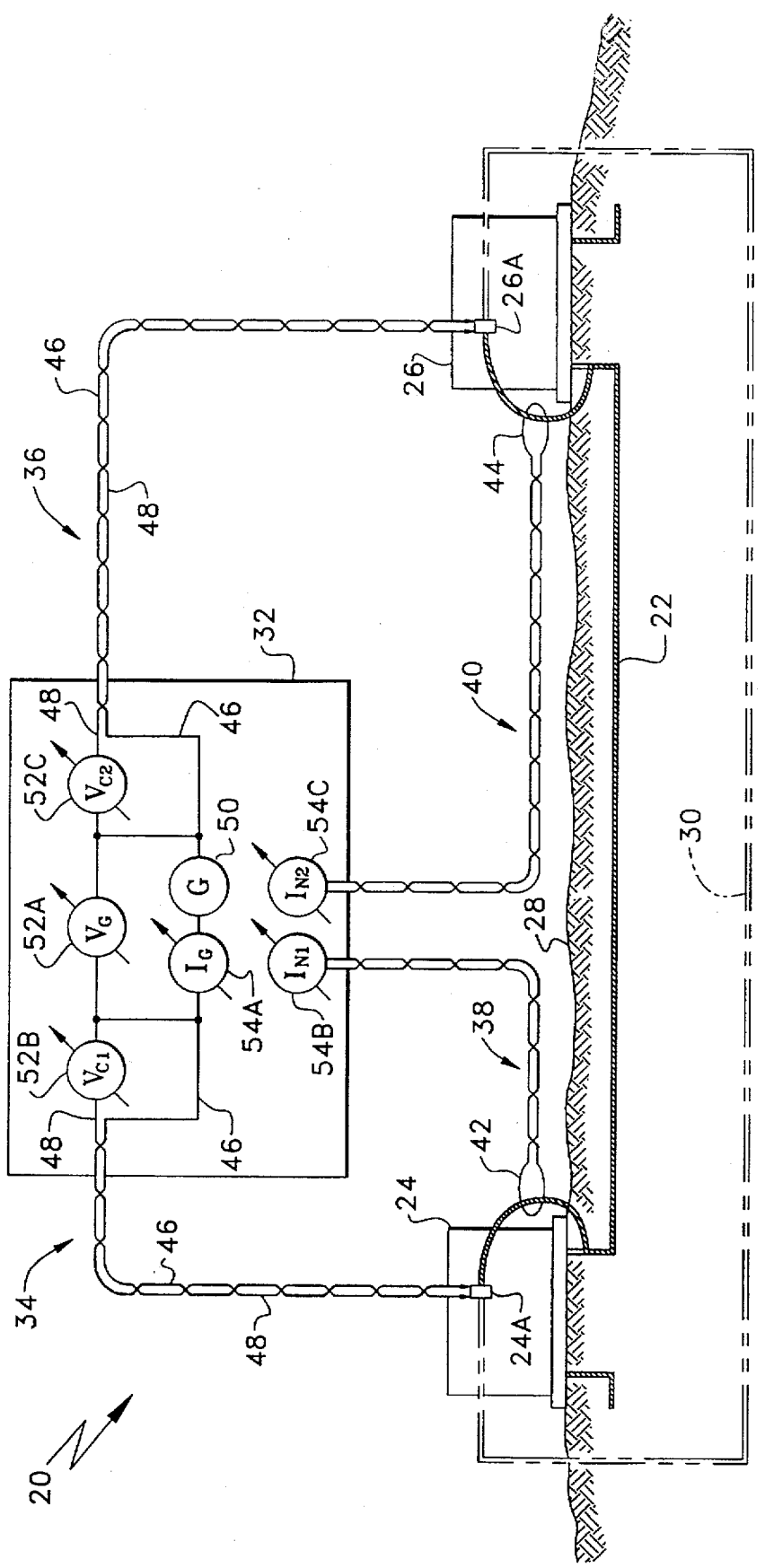
FIG. 1 constitutes a functional block diagram and partial schematic diagram of the method of use and system of the subject invention shown in use for determining the longitudinal active resistance of the neutral conductor of a typical electrical system utilizing an underground electrical cable.

Referring to the various figures of the drawing wherein reference numbers refer to like parts there is shown in FIG. 1 a method of use and system 20 for determining the longitudinal active resistance of the neutral conductor 22 of an underground electrical cable (e.g., a URD-underground rural distribution-cable), including a phase conductor (not shown) of an electrical cable, of an electrical power system without having to remove the electrical cable from service. In other words, the electrical cable remains connected to the electrical system providing normal electrical service to the electrical system. In FIG. 1, a portion of a typical underground electrical power system is shown. That portion of this electrical power system basically comprises a pair of transformers 24 and 26 pad-mounted or submersible (or any other grounded electrical device, e.g., a junction box, that permits electrical access to the neutral conductor 22), connected by the electrical cable with its neutral conductor 22. The neutral conductor 22 forms the current return conductor on the electrical cable. The electrical cable with its neutral conductor 22 is buried in the conductive medium (e.g., soil, water) 28. Furthermore, a bypass path 30 is shown (in phantom) to represent, as discussed earlier, both metallic and non-metallic conductors, that reduce the test current signal through the neutral conductor 22 under test.

It must be pointed out at this juncture that the electrical system shown in FIG. 1 is merely exemplary of various types of systems utilizing various structures connected by various types of electrical cables having different types of neutral conductors (bare or jacketed, concentric or not, direct-buried or in conduits), in which the method of use and system 20 of this invention can be used.

The system 20 basically comprises an instrumentation station 32, two signal-voltage cables 34 (C1) and 36 (C2), two current cables 38 and 40 which connect to respective current probes 42 and 44. The station 32 is arranged to provide a test current signal on the neutral conductor 22 of the electrical cable without having to remove the cable from service. As shown in FIG. 1, the signal-voltage cables 34 and 36 are connected between the station 32 and the transformers 24 and 26, respectively (e.g., in particular, at neutral conductor terminals 24A and 26A located within the transformers 24 and 26, respectively), for impressing the test current signal on the neutral conductor 22. Voltage drops (i.e., voltage waveforms), due to the presence of the test current signal through the cables 34 and 36 and through the neutral conductor 22, as well as current waveforms, are then determined and used in calculating the longitudinal active resistance, as will be discussed further below.

Each signal-voltage cable 34 and 36 comprise a test current signal conductor 46 and a voltage sensing conductor 48 that are wound to form bifilar windings (i.e., twisted pairs of conductors), as opposed to single conductor test cables. The bifilar winding mitigates the magnetic interference of the test current signal conductor 46 on the voltage sensing conductor 48. Similarly, the current cables 38 and 40 also have bifilar winding configurations and are coupled to the neutral conductor 22 via the current probes 42 and 44 (e.g., preferably Hall-effect clamps at AC application), respectively.

Although not shown in FIG. 1, the signal-voltage cable 34 and the current cable 38 can be gathered into one cable forming two twisted pairs; similarly, the signal-voltage cable 36 and the current cable 40 can be gathered into one cable forming two twisted pairs.

The station 32 includes any conventional instrumentation means which comprises selective frequency test signal generation means 50 (G) (e.g., a Network Analyzer Type 8751 manufactured by Hewlett Packard and Power Amplifier Type Techron 7560 manufactured by Crown International), voltage waveform determining means 52A, 52B and 52C, and current waveform determining means 54A, 54B and 54C (e.g., also a Network Analyzer Type 8751) for obtaining the respective waveforms, as will be discussed below. From these waveforms, the phase angles between voltages and currents (e.g., $\psi_G$, $\psi_{C1}$, and $\psi_{C2}$, which will also be discussed later) can be determined and used for calculating the longitudinal active resistance of the neutral conductor 22 under test. An exemplary method of determining the phase angles is by the use of the time difference between the zero crossings of the voltage and current.

Hereinafter, the term "waveform" is meant to include both RMS (root-mean-square) magnitudes of voltage and current and respective phase angles between voltage and current (e.g., current through the neutral conductor under test.)

Figure 2:
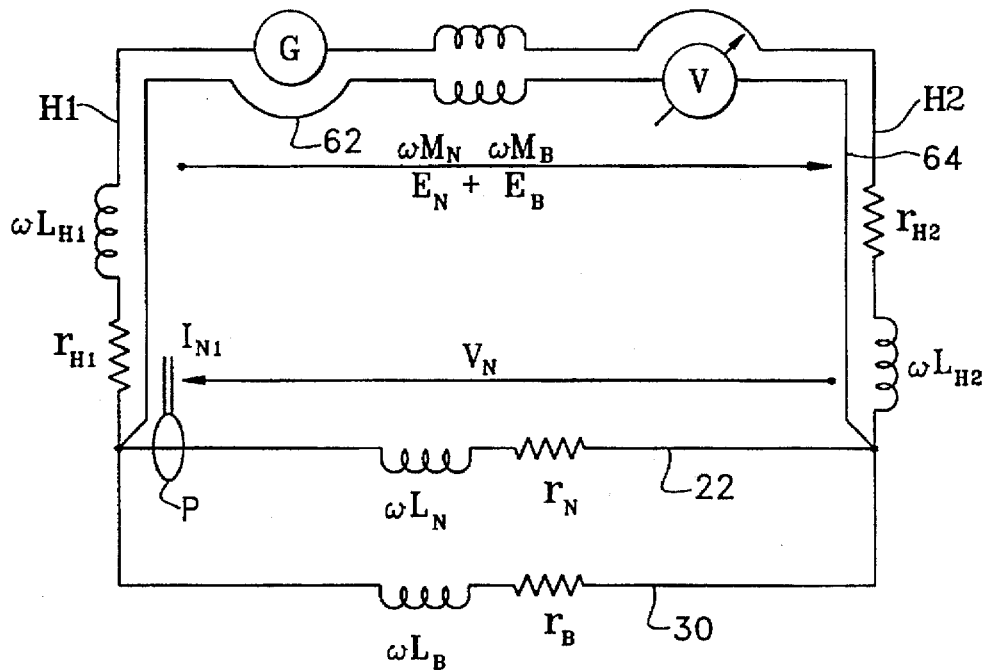
FIG. 2 is an equivalent electrical circuit of a prior art system using direct voltage measurement.

The problem encountered with direct measurement of the voltage drop on a neutral conductor is shown in FIG. 2 using an equivalent electrical circuit. In this circuit, a selective frequency test signal generator, G, is connected across the neutral conductor 22 under test via a first test harness H1 and a second test harness H2. The harnesses H1 and H2 and the neutral conductor 22 and the bypass path 30 are modeled as having active resistance components ($r_{H1}$, $r_{H2}$, $r_N$ and $r_B$) and inductive resistance components ($\omega L_{H1}$, $\omega L_{H2}$, $\omega L_N$ and $\omega L_B$).

A voltage waveform device, V, is connected across the neutral conductor 22 in order to obtain the voltage waveform across the neutral conductor 22 ($V_N$) due to the test current signal from the selective frequency test signal generator, G. By using direct voltage measurement, an additional voltage has been induced in the voltmeter circuit (62 and 64) by the test current circulating in the test signal circuit. In particular, what the voltage waveform device V actually measures is the RMS magnitude of the vectorial sum of $\dot{V}_N + \dot{E}_N + \dot{E}_B$, where $\dot{E}_N$ is the electromotive force induced by the neutral conductor 22 and $\dot{E}_B$ is the electromotive force induced by the bypass path 30. Hereinafter the dotted parameter indicates that the parameter is a phasor; furthermore, where the phasor parameter is shown undotted, this indicates the RMS magnitude of the phasor. The reason for this is that inductive interference effects, namely $\omega M_N$ (from the neutral conductor 22) and $\omega M_B$ (from the bypass path 30) are operating. Therefore, if the voltage waveform obtained by the device V is used in conjunction with the test current waveform determined by a current probe P in the neutral conductor 22, $\dot{I}_{N1}$, the derivation of the longitudinal active resistance, $r_N$, based on:

$$r_N = (V/I_{N1}) \cos \phi_N,$$

where $\phi_N$ is the phase angle between $\dot{V}$ and $\dot{I}_{N1}$, is erroneous since it does not take into account the inductive interference effects caused by the neutral conductor 22 as well as the bypass path 30. Only in particular cases, i.e., when the test current in the neutral conductor 22 under test is in-phase with the test current in the bypass path 30, can the neutral conductor longitudinal active resistance be calculated correctly using this prior art method and system.

The present invention 20 overcomes this problem by using indirect voltage determination. To that end, as shown in FIG. 1, the voltage waveform across the test cable 34, $\dot{V}_{C1}$, is determined by the station 32 via voltage waveform determining means 52B, the voltage waveform across the test cable 36, $\dot{V}C2$, is determined by the station 32 via voltage waveform determining means 52C, and the voltage waveform across the generator 50, $\dot{V}_G$, is also determined by the station 32 via voltage waveform determining means 52A. In accordance with Kirchhoff's voltage law, since the net voltage around a closed loop must be zero, the desired neutral conductor 22 voltage waveform ($\dot{V}_N$) is given by the vectorial equation: $\dot{V}_N = \dot{V}_G - \dot{V}_{C1} - \dot{V}_{C2}$.

Figure 3:
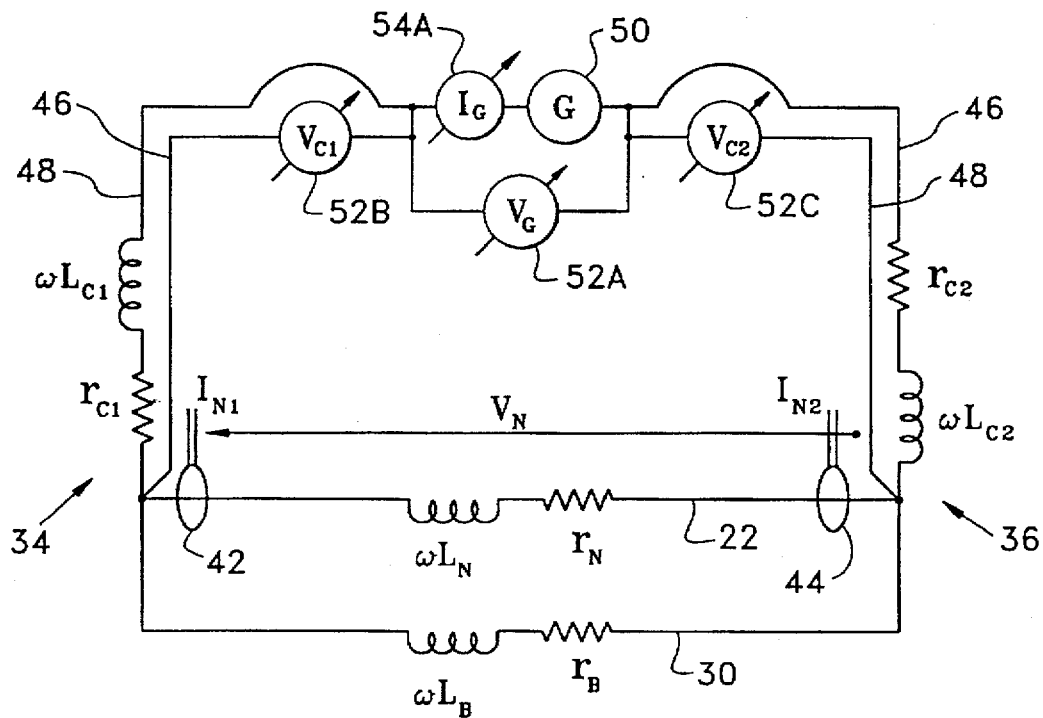
FIG. 3 is an equivalent electrical circuit of the invention of FIG. 1 using indirect voltage determination.

An equivalent electrical circuit of the present invention 20 of FIG. 1 is shown in FIG. 3. In FIG. 3, the cables 34 and 36, the neutral conductor 22 and the bypass path 30 are modeled as having active resistance components ($r_{C1}$, $r_{C2}$, $r_N$ and $r_B$) and inductive resistance components ($\omega L_{C1}$, $\omega L_{C2}$, $\omega L_N$ and $\omega L_B$). Since the test current waveform in the neutral conductor 22, $\dot{I}_{N1}$, is also determined, an expression for the longitudinal active resistance of the neutral conductor ($r_N$) is given by:

$$r_N = (V_G \cos \phi_G - V_{C1} \cos \phi_{C1} - V_{C2} \cos \phi_{C2})/I_{N1},$$

where $\phi_G$ represents the phase angle between $\dot{V}_G$ and $\dot{I}_{N1}$, $\phi_{C1}$ represents the phase angle between $\dot{V}_{C1}$ and $\dot{I}_{N1}$, $\phi_{C2}$ represents the phase angle between $\dot{V}_2$ and $\dot{I}_{N1}$, and where $V_G \cos \phi_G$ represents the active voltage component of $\dot{V}_G$, $V_{C1} \cos \phi_{C1}$ represents the active voltage component of $\dot{V}_{C1}$, $V_{C2} \cos \phi_{C2}$ represents the active voltage component of $\dot{V}_{C2}$.

By using such an indirect voltage determination method, the induced voltages by the neutral conductor 22 and the bypass path 30, namely $\dot{E}_N$ and $\dot{E}_B$, are mitigated. Furthermore, use of the bifilar winding configuration of the cables 34 and 36 further reduces the magnetic interference on the voltmeter circuits, i.e., the circuits comprising voltage waveform determining means 52B and 52C. It should be noted that use of the bifilar winding configuration for the signal-voltage cables 34 and 36 increases induced voltage effects and increases the method error in direct voltage measurement (FIG. 2).

Figure 4:
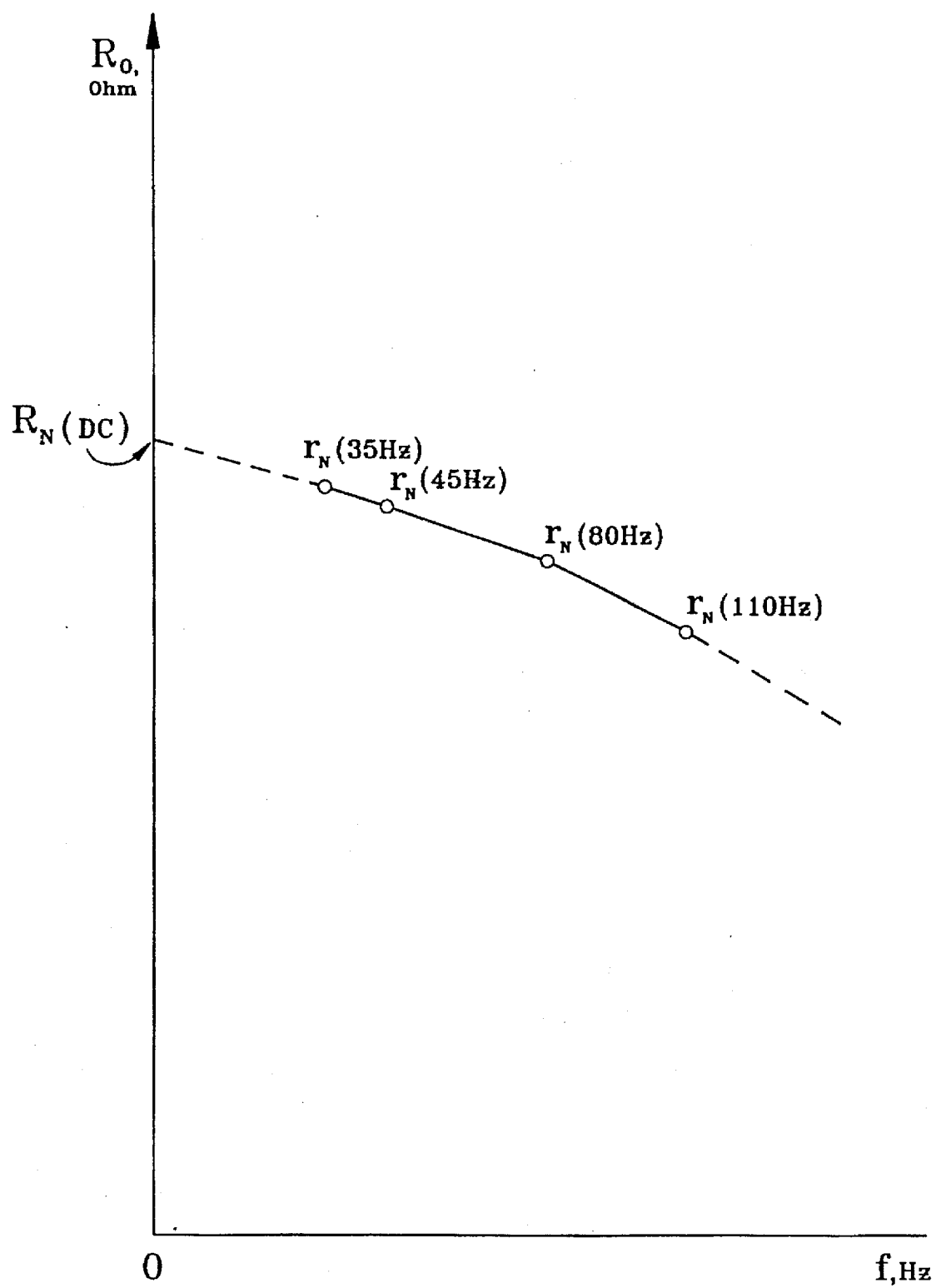
FIG. 4 depicts an extrapolation method for determining the longitudinal active resistance of the neutral conductor under test at 0 Hz.

It should be further noted that the $r_N$ value is not the final value for the longitudinal active resistance of the neutral conductor since that value is still frequency-dependent, i.e., the $r_N$ value varies depending on the frequency of the test current signal. Therefore, a plurality of different test current signal frequencies (e.g., 35, 45, 80, 110 and 150 Hz, @ 1–7 Amps and hereinafter known as "selective frequencies") are used to generate data, and thereby calculate a plurality of $r_N$ values. These plurality of $r_N$ values are then inputted into an extrapolation means (not shown) which uses any well-known extrapolation method (FIG. 4) on these plural longitudinal active resistance values to derive a resistance value ($R_N$) at 0 Hz. This resistance value, $R_N$, at 0 Hz is the desired longitudinal active resistance value of the neutral conductor 22. This $R_N$ value may then be compared with the neutral conductor DC resistance value from cable manufacturer's data. Based on that comparison, the customer can then decide whether to conduct the precise neutral corrosion survey described in U.S. Pat. Nos. 5,347,212, 5,451,862 and 5,498,967 (Bass et al.).

The above-described method of use and system 20 can be further enhanced when a current balance test and a current partition test are included. To that end, the current balance test permits the measurement of test current into and out of the neutral conductor 22 under test. In particular, the current balance test uses current waveform determining means 54B and current waveform determining means 54C to measure the test current present at one end of the neutral conductor 22 under test (e.g., $I_{N1}$) and at the other end of the neutral conductor 22 under test ($I_{N2}$), respectively. The ratio of $I_{N1}/I_{N2}$ provides an indication of the electrical continuity of the neutral conductor 22 under test. Furthermore, the current partition test uses the current waveform determining means 54B to obtain the test current waveform present in the neutral conductor 22 under test ($I_{N1}$) and uses the current waveform determining means 54A to obtain the test signal generator current waveform ($I_G$) from the selective frequency test signal generation means 50 (G). The ratio of $I_{N1}/I_G$ verifies the relative amount of test current actually passing through the neutral conductor 22 under test. The use of the current partition test, in addition to the current balance test, aids in identifying those situations where a satisfactory continuity condition may not reveal a more serious problem with the neutral conductor 22 under test (e.g., symmetrical breaks of the neutral conductor 22).

Figure 5:
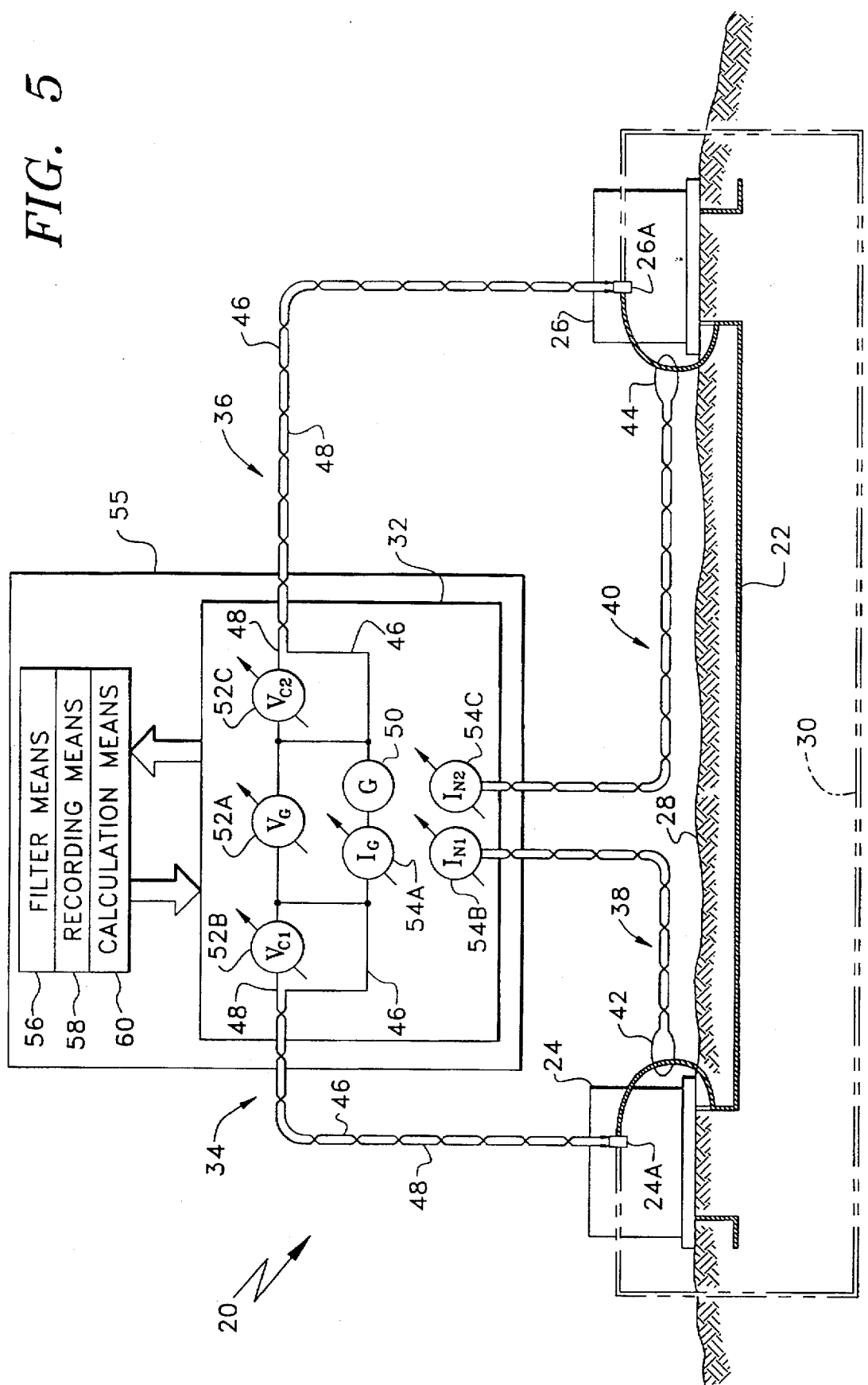
FIG. 5 depicts a computerized instrumentation station for use in the present invention.

As discussed earlier, the instrumentation station 32 may typically comprise discrete equipment coupled in accordance with FIG. 1. Alternatively, the instrumentation station 32 may be part of a computerized instrumentation station 55 as shown in FIG. 5. Typically, such a computerized instrumentation station 32 comprises a computer (any conventional portable computer) which includes all of the voltage and current waveform determining means (52A through 54C), as well as selective frequency filter means 56, recording means of voltage and current waveforms 58 and calculation means 60 for determining, among other things, the phase angles ($\phi_G$, $\phi_{C1}$, and $\phi_{C2}$, discussed previously) between the voltage and current, for determining the longitudinal active resistance of the neutral conductor 22 under test, and for determining the current balance ratio ($I_{N1}/I_{N2}$) and the current partition ratio ($I_{N1}/I_G$). An exemplary instrumentation software package that can be used in this computerized instrumentation station 55 is the instrumentation software LABVIEW by National Instruments of Houston, Tex. used in conjunction with the separate test signal generation means 50 (G) for providing the proper test current signal(s). As discussed earlier, a plurality of different test current frequencies (e.g., 35, 45, 80, 110 and 150 Hz, @ 1–7 Amps) are used by the computerized instrumentation station 55 to generate data and thereby calculate a plurality of $r_N$ values. The calculation means 60, which incorporates the extrapolation means discussed earlier, performs the extrapolation method (FIG. 4) on these plural longitudinal active resistance values to derive a resistance value ($R_N$) at 0 Hz.

In addition, both the instrumentation station 32 or the computerized instrumentation station 55 are transportable so that they can be located adjacent the starting point of the test, e.g., the transformer 24. If desired the stations 32 or 55 can be moved to various positions between the transformers 24 and 26. To expedite either of their locations, the station 32 or the computerized station 55 are preferably mounted in a vehicle, although it is contemplated that both may be portable.

It should be noted that the selective frequency test current signals used in the present invention are preferably non-harmonic frequencies of the native AC (e.g., 60 Hz for a power system). It is desirable to utilize at least one selective frequency below the native AC frequency and at least one selective frequency above the native AC to facilitate customer use since the customer operates its system at the native AC frequency.

It should also be noted that this method of use and system 20 is applicable to communication cables (e.g., telephone cables) and other non-utility applications that have similar cable construction, e.g., a neutral conductor electrically grounded at both ends. As such, the method of use and system 20 shown in FIGS. 1 and 3–5 could be applied in a communication system or other non-utility system for determining the longitudinal active resistance of the neutral conductor while the communication or other non-utility system remains in normal operation, i.e., energized. In those systems, the range of selective frequency test current signals would cover those systems' native AC frequencies (e.g., 400 Hz) appropriate to those systems' operation, rather than the native AC frequency of 60 Hz used in power systems.

Without further elaboration the foregoing will so fully illustrate my invention that others may, by applying current or future knowledge, adopt the same for use under various conditions of service.

I claim:

1. A method for non-intrusively determining the longitudinal active resistance of a neutral conductor of an underground electrical cable forming a portion of an electrical system, the electrical cable additionally comprising a phase conductor carrying AC current therethrough while the electrical cable remains connected to the electrical system providing normal electrical service to the electrical system, the neutral conductor being connected between a pair of electrically grounded structures, said method for determining being accomplished while leaving the electrical cable in normal operation and comprising the steps of:

(a) impressing an electrical test current signal of a selective frequency on the neutral conductor from a test signal generator connected between the electrically grounded structures using a first signal-voltage cable and a second signal-voltage cable, while the electrical cable remains in service providing normal electrical service to the electrical system and while the neutral conductor remains connected to the grounded structures;

(b) determining a voltage waveform across said first signal-voltage cable to form a first voltage waveform;

(c) determining a voltage waveform across said second signal-voltage cable to form a second voltage waveform;

(d) determining a voltage waveform across said test signal generator to form a third voltage waveform;

(e) determining a current waveform through the neutral conductor;

(f) calculating a longitudinal from s resistance value from said determined waveforms, each of said waveforms includes a respective RMS magnitude.

2. The method of claim 1 additionally comprising the step of impressing another electrical test current signal of a different selective frequency and repeating steps (a)–(f) to obtain a plurality of longitudinal active resistance values.

3. The method of claim 2 wherein said plurality of longitudinal active resistance values are entered into an extrapolation process for extrapolating a longitudinal active resistance value at 0 Hz.

4. The method of claim 1 wherein said step of calculating said longitudinal active resistance value comprises:

(a) calculating a respective phase angle between each of said voltage waveforms and said neutral conductor current waveform to determine an active voltage component for said first voltage waveform, said second voltage waveform and said third voltage waveform, respectively;

(b) subtracting the sum of said first active voltage component and said second active voltage component from said third active voltage component to determine an active voltage component for the neutral conductor; and (c) dividing said active voltage component for the neutral conductor by a neutral conductor current to determine said longitudinal active resistance value.

5. The method of claim 4 wherein said step of calculating a respective phase angle uses a time difference between zero crossings of said voltage waveforms and said neutral conductor current waveform.

6. The method of claim 4 additionally comprising the step of impressing another electrical test current signal of a different selective frequency and repeating steps (a)–(c) to obtain a plurality of longitudinal active resistance values.

7. The method of claim 6 wherein said plurality of longitudinal active resistance values are entered into an extrapolation process for extrapolating a longitudinal active resistance value at 0 Hz.

8. The method of claim 1 wherein the neutral conductor has a first end and a second end and wherein the step of determining said current waveform through the neutral conductor comprises determining a first current waveform at the first end of the neutral conductor and determining a second current waveform at the second end of the neutral conductor.

9. The method of claim 8 further comprising the step of determining a ratio between the RMS magnitude of said first current waveform and the RMS magnitude of said second current waveform.

10. The method of claim 1 wherein said method comprises the step of determining a test signal current waveform through said test signal generator.

11. The method of claim 10 further comprising the step of determining a ratio between the RMS magnitude of said current waveform through the neutral conductor and the RMS magnitude of said test signal generator current waveform.

12. A non-intrusive testing system for determining the longitudinal active resistance of a neutral conductor of an underground electrical cable forming a portion of an electrical system, the electrical cable additionally comprising a phase conductor carrying AC current therethrough while the electrical cable remains connected to the electrical system providing normal electrical service to the electrical system, the neutral conductor being connected between a pair of electrically grounded structures, said testing system being arranged for use with the electrical cable while the cable remains in normal operation and comprising:

(a) first means for impressing an electrical test current signal of a selective frequency on the neutral conductor and connected to the neutral conductor with a first signal-voltage cable and a second signal-voltage cable, while the electrical cable remains connected to the electrical system providing normal electrical service to the electrical system and while the neutral conductor remains connected to the grounded structures, (b) a first voltage waveform determining means connected across said first signal-voltage cable for determining a first voltage waveform;

(c) a second voltage waveform determining means connected across said second signal-voltage cable for determining a second voltage waveform;

(d) a third voltage waveform determining means connected across said first means for impressing an electrical test current signal for determining a third voltage waveform;

(e) first current waveform determining means for determining a first current waveform through the neutral conductor, each of said waveforms includes a respective RMS magnitude of voltage or current and respective phase angle between voltage and current.

13. The system of claim 12 wherein each of said determining means comprises analyzer means for determining a respective phase angle between each of said voltage waveforms and said first current waveform, respectively, for calculating a longitudinal active resistance from said voltage waveforms, said first current waveform and said respective phase angles.

14. The system of claim 13 wherein said analyzer means uses a time difference between zero crossings of said voltage waveforms and said first current waveform for determining said respective phase angles.

15. The system of claim 13 further comprising an extrapolation means, said extrapolation means extrapolating a longitudinal active resistance value at 0 Hz from a plurality of longitudinal active resistance values at different selective frequencies greater than 0 Hz inputted to said extrapolation means.

16. The system of claim 12 wherein said first signal-voltage cable comprises a test current signal conductor and a voltage sensing conductor arranged into a bifilar winding configuration.

17. The system of claim 16 wherein said second signal-voltage cable comprises a test current signal conductor and a voltage sensing conductor arranged into a bifilar winding configuration.

18. The system of claim 12 wherein the neutral conductor comprises a first end and a second end and wherein said system further comprises said first current waveform determining means for determining said first current waveform at the first end of the neutral conductor and a second current waveform determining means for determining a second current waveform at the second end of the neutral conductor.

19. The system of claim 12 wherein said system comprises a second current waveform determining means for determining an electrical test current signal waveform through said first means for impressing an electrical test current signal.

20. The system of claim 12 further comprising filter means and recording means coupled to said first means, to said voltage waveform determining means and to said first current waveform determining means.

21. The system of claim 20 further comprising calculation means, coupled to said filter means and to said recording means, for calculating a respective phase angle between each of said voltage waveforms and said first current waveform, respectively, and for calculating a longitudinal active resistance from said voltage waveforms, said first current waveform and said respective phase angles.

22. The system of claim 21 wherein said calculation means further comprises extrapolation means for extrapolating a longitudinal active resistance value at 0 Hz from a plurality of longitudinal active resistance values at different selective frequencies greater than 0 Hz.

23. The system of claim 22 wherein said voltage waveform determining means, said first current waveform determining means, said calculation means, said filter means and said recording means form a portion of a computer.

24. The system of claim 23 wherein said computer is located in a vehicle.

25. The system of claim 22 wherein the neutral conductor comprises a first end and a second end and wherein said system further comprises said first current waveform determining means for determining said first current waveform at the first end of the neutral conductor and a second current waveform determining means for determining a second current waveform at the second end of the neutral conductor, said first current waveform determining means and said second current waveform determining means being coupled to said calculation means wherein said calculation means calculates a ratio of the RMS magnitude of said first current waveform to the RMS magnitude of said second current waveform.

26. The system of claim 22 further comprising a second current waveform determining means coupled to said first means and to said calculation means, said second current waveform determining means determining an electrical test current signal waveform having an RMS magnitude, said first current waveform determining means also being coupled to said calculation means, said calculation means calculating a ratio of the RMS magnitude of said electrical test current signal waveform to the RMS magnitude of said first current waveform through the neutral conductor.

* * * * *